United States Patent [19]

Shohet

[11] Patent Number: 4,975,634

[45] Date of Patent: Dec. 4, 1990

[54] JITTER MEASUREMENT DEVICE

[75] Inventor: Yuval Shohet, Acton, Mass.

[73] Assignee: General Signal Corporation, Stamford, Conn.

[21] Appl. No.: 334,365

[22] Filed: Apr. 7, 1989

[51] Int. Cl.$^5$ ............................................. G01R 25/00
[52] U.S. Cl. .................................................. 324/83 R
[58] Field of Search .................... 324/83 R, 83 D, 85; 375/118; 364/486

[56] References Cited

U.S. PATENT DOCUMENTS

| | | | |
|---|---|---|---|
| 3,737,766 | 6/1978 | Lubarsky, Jr. | 324/83 R |
| 3,820,022 | 6/1974 | Watt | 324/83 D |
| 4,412,299 | 10/1983 | Huffman | 375/118 |
| 4,654,586 | 3/1987 | Evans, Jr. et al. | 324/83 R |
| 4,819,080 | 4/1989 | Cucchietti et al. | 324/83 R |

OTHER PUBLICATIONS

"DS3 Jitter Measurements with the S5200 D", Tau-Tron, Inc. *Application Note*, AN-1, Dec. 1982.
"DS1, DS1C, DS2 and DS3 Error Measurement and Monitoring", Tau-Tron, Inc. *Application Note*, AN-7, Oct. 1983.
"Jiller, WJITS and Digital Transmission Systems", Tau-Tron, Inc., *Application Note*, AN-8, Jan. 1984.
"Eye Diagram Measurments on Sampling Oscilloscope", Tau-Tron, Inc., *The Pulse*, by Philip Gendron (vol. IV, reprint).
"Jitter in Digital Transmission systems", Tau-Tron, Inc., *Technical Note*, by William W. Rollins.
Error Second Measurements as Performance Indications for Digital Tramsmission Systems, by William Rollins (Tau-Tron, Inc.).

*Primary Examiner*—Herzon E. Williams
*Assistant Examiner*—Louis M. Arana
*Attorney, Agent, or Firm*—Barnes & Thornburg

[57] ABSTRACT

Jitter is measured by applying a first clock signal to a device-under-test, measuring the phase difference between the jittered clock signal received from the device-under-test and a reference clock signal, and converting the phase difference to a jitter measurement. The phase difference is measured by counting the number of high frequency clock pulses between a transition of the jittered clock signal and a transition of the reference clock signal. The phase difference is converted to a jitter measurement by determining the highest and lowest phase difference count and taking the difference between the highest and lowest count. The phase of the reference clock signal can be adjusted as a function of the highest and lowest count by determined the mean value of the highest and lowest count and adjusting the reference clock to be of this mean value. The range of the jitter measurement can be adjusted by adjusting the frequency of high frequency clock to the counter, the jittered signal received from the device-under-test and the reference clock signal.

30 Claims, 2 Drawing Sheets

JITTER MEASUREMENT DEVICE

BACKGROUND AND SUMMARY OF THE INVENTION

The present invention relates to jitter measuring devices and more specifically to an improved device and method of measuring jitter of a clock signal.

When a reference signal is modulated by a second signal, such as noise, zero crossing of the reference signal is changed backward and forward. This change of phase is defined as jitter. In many applications which involve clock recovery, it is desirable to measure the amount of jitter. The prior art jitter measuring device Hewlett-Packard HP-3785B, for example, uses analog circuits and has an accuracy of 0.035UI±4% for a jitter clock having a frequency of 1.544 mhz. Being an analog device, it is sensitive to temperature variations and aging. Also the range of jitter measurement is limited. The device also does not allow the adjustment of the phase between the jitter clock and the reference clock.

Thus, it is an object of the present invention to provide a jitter measurement device and method which is more accurate than the prior art devices.

It is another object of the present invention to provide a jitter measurement device and technique which is insensitive to temperature or aging.

A still further object of the present invention is to provide a jitter measurement device and method using a simplified circuit.

An even further object of the present invention is to provide a jitter measurement device and method having a variable range of jitter measurement.

A still even further object of the present invention is to provide a jitter measurement device and method which is capable of adjusting the phase between the jitter clock and the reference clock even to the point of centering.

These and other objects are achieved by applying a first clock signal to a device-under-test, measuring the phase difference between the jittered clock signal received from the device-under-test and a reference clock signal, and converting the phase difference to a jitter measurement. The phase difference is measured by counting the number of high frequency clock pulses between a transition of the jittered clock signal and a transition of the reference clock signal. The phase difference is converted to a jitter measurement by determining the highest and lowest phase difference count and taking the difference between the highest and lowest count. The phase of the reference clock signal can be adjusted as a function of the highest and lowest count by determining the mean value of the highest and lowest count and adjusting the reference clock to be of this mean value.

The range of the jitter measurement can be adjusted by adjusting the frequency of the high frequency reference clock signal to the counter, the jittered signal received from the device-under-test and the reference clock signal. The frequency of the reference clock is selected to be a harmonic of the first clock signal. This is produced by generating the jitter-free first clock signal and the reference clock signal from the high frequency clock signal, which clocks the counter, with appropriate dividers. This also provides for appropriate adjustment of the range.

The jitter measuring device would include a first clock for producing a jitter-free clock signal to be provided to the device-under-test, a second clock for producing a reference clock signal, a measuring circuit for measuring the phase difference between a jittered clock signal received from the device-under-test and the reference clock signal, and a conversion circuit for converting the phase difference to a jitter measurement. A counter is provided to count high frequency clock signals from a high frequency clock and the measurement circuit controls the start and stop of counting based on a transition of the jittered clock signal and the reference clock signal. The conversion circuit determines the highest and lowest count and uses the difference therebetween as the jitter measurement. A latch is provided at the output of the counter to latch the value of the counter. The conversion circuit includes a high latch and a low latch and comparator circuits for comparing the count latch value with the high and low latches and entering the lowest value between the low latch value and the counter latch value in the low latch and the highest value between the highest latch count and the latch counter count in the high latch. The difference between these two latches is the peak to peak jitter. The highest and lowest count value in the high and low latches are also used to determine the mean count value, which is used to adjust the phase of the reference clock. The phase is adjusted by converting the mean value into an adjustment value and delaying the transmission of signals from the high frequency count to the divider for the reference clock by a given count value. This produces the phase adjust.

Other objects, advantages and novel features of the present invention will become apparent from the following detailed description of the invention when considered in conjunction with the accompanying drawings.

DETAILED DESCRIPTION OF THE DRAWINGS

Figure 1:
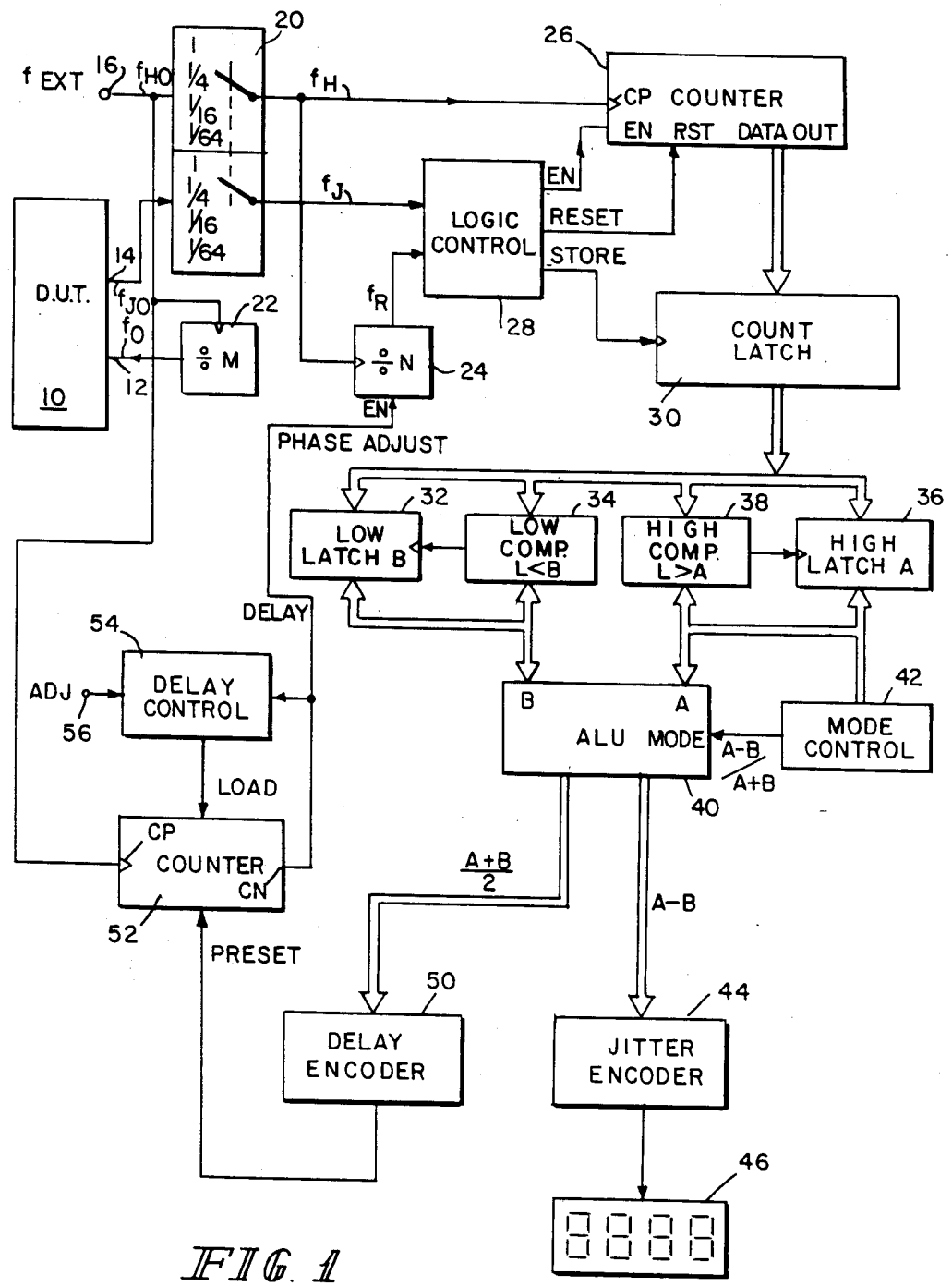
FIG. 1 is a block diagram of a jitter measurement device according to the principles of the present invention.

A jitter measurement device as illustrated in FIG. 1, tests the jitter of a clock of a device-under-test 10. An output terminal 12 of the jitter measurement device is connected to the clock input of the unit-under-test 10 and an input terminal 14 is connected to the clock output of the device-under-test 10. An input terminal 16 also receives an external high frequency clock signal $f_{Ho}$. Although the high frequency clock signal may be provided by an external source, a high frequency clock source may be provided within the jitter measuring device. A range adjusting circuit 20, to be explained more fully below, adjusts the frequency of the high frequency clock signal $f_{Ho}$ from terminal 14 and the jittered clock signal $f_{Jo}$ from terminal 16. The adjustment is illustrated as a pair of gang switches such that the adjustment of the high frequency clock $f_H$ and the jittered clock signal $f_{Jo}$ are both adjusted by the similar amount to produce signals $f_H$ and $f_J$.

The high frequency clock signal $f_{Ho}$ is provided to a jitter free clock generator 22 to produce the jitter-free clock signal $f_0$ at terminal 12 to be used by the device-under-test 10 and high frequency clock signal $f_H$ to a reference clock generator 24 to provide the jitter free reference clock signal $f_R$. The clock generators 22 and 24 are dividers wherein the high frequency signal $f_{Ho}$, $f_H$ is divided by m and n respectively. As will be explained more fully below, the m is selected to be greater than n such that the jitter-free clock signal $f_0$ and the resulting jittered clock signal $f_J$ are harmonics of the reference clock signal $f_R$. The high frequency clock signal $f_H$ is also provided to the clock input of a counter 26.

A logic control 28 receives the jittered clock signal $f_J$ and the reference clock signal $f_R$ and controls the enable and reset terminals of the counter 26. A latch 30 is connected to the output of counter 26 and is also controlled by the logic control 28 to store a value of the counter 26. The logic control 28 is responsive to a transition of the jittered clock signal $f_J$ to enable a counter 26 to start counting the high frequency pulses $f_H$. Upon a transition of the reference clock signal $f_R$, the logic control stops the count. Therefore, the count represents the instantaneous phase difference between the jittered frequency $f_J$ and the reference frequency $f_R$.

Figure 2:
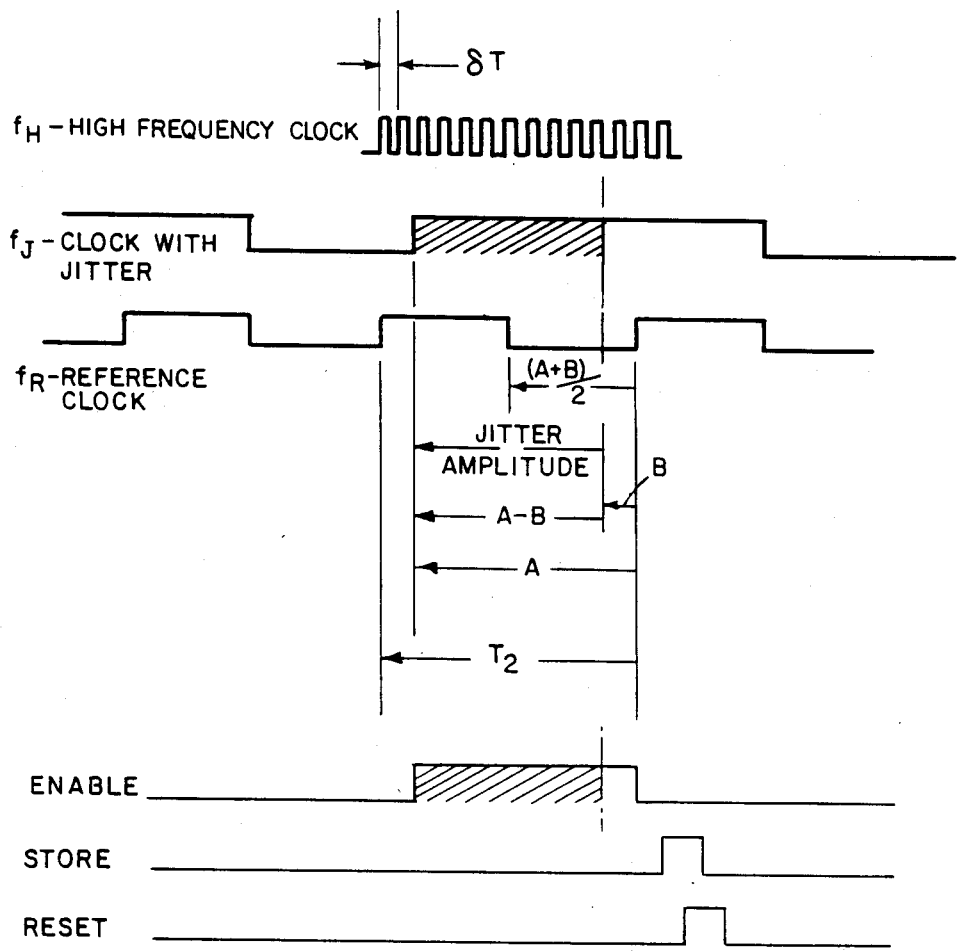
FIG. 2 is a timing diagram for the block diagram of FIG. 1.

As illustrated in FIG. 2, the enable signal goes high in response to an $f_J$ transition and goes low in response to an $f_R$ transition. The store signal is activated after the enable goes low with enough delay to let the counter 26 to settle, and the reset signal following thereafter. This allows the counter to be ready to measure the next instantaneous phase difference beginning with the transition or zero crossing of the jitter clock signal $f_J$.

Once the count which represents the phase difference between the jittered signal $f_J$ and the reference signal $f_R$ is stored in latch 30, a conversion circuit converts this value to a jitter measurement. The conversion circuit includes a low count latch 32, a low comparator 34, a high count latch 36 and a high comparator 38. The low comparator 34 compares the value of the count in count latch 30 with the value in the low latch 32. If the value in the count latch 30 is lower than the value in the low latch 32, the value in the count latch 30 is substituted for the value in low latch 32. If the value in low latch 32 is less than the value in count latch 30, the contents of the low latch 32 is not changed. Similarly, the high comparator 38 compares the value in the high latch 36 with the value in the count latch 30 and stores in the high latch 36 the larger of the two values. The low latch value B and the high latch value A are provided to an arithmetic logic unit 40. These values represent the negative peak and positive peak respectively.

The jitter measurement circuit has the ability of providing not only a jitter measurement, but also an adjustment of the phase of the reference clock signal $f_R$ to the phase of the jittered clock signal $f_J$. A mode control 42 controls the mode of the arithmetic logic unit 40 to perform or be in either the jitter measurement mode or the phase adjustment mode. In the jitter measurement mode, the arithmetic logic unit subtracts the lowest phase difference of count B from the highest phase difference of count A and provides it as a value to the jitter encoder 44. The jitter encoder 44 converts the difference, which are the peak to peak instantaneous values from the counters 26, into a jitter measurement of appropriate units and provides it to the display 46. The encoder 44 may be a look-up table or other well-known device.

The mode control 42 causes the arithmetic logic unit 40 to perform the necessary calculations for the jitter measurement and the adjustment for a given cycle. For example, every one half of a second, the arithmetic logic unit subtracts the lowest phase difference count B from the highest phase difference count A and provides it on the display 46. A mean of the highest and lowest phase difference is calculated immediately after, the sum of highest and lowest signal divided by two. With the change of modes and after the two calculations, the mode controller 42 resets the high and low latches 32, 36 such that a new cycle of the accumulation of the highest and lowest frequency difference counts may begin.

The mean value $(A+B)/2$ is provided to a delay encoder 50. The delay encoder 50 converts the mean count value to a specific time delay and stores it in a counter 52. A delay controller 54 activated by manual input, for example a push button on terminal 56, enables counter 52 to count down using the high frequency clock $f_{Ho}$. Alternatively, the phase adjust may be automatically activated. Once the counters reach zero, the reference frequency clock generator 24 is enabled. Thus, during the time period represented by the number preloaded into counter 52, the reference frequency clock generator 24 is not counting the high frequency clock signals $f_H$. This delays the cycle and therefore adjusts the phase of the reference clock signal $f_R$. The delay encoder 50 attempts to position the reference clock signal $f_R$ 180° out of phase with the jittered clock signal $f_J$, as illustrated in FIG. 2.

For measurement of high unit interval jitter, the range selector 20 divides the high frequency clock $f_{Ho}$ to the high speed counter 26, the reference clock $f_R$, and the jitter clock $f_J$ by an appropriate value. Dividing these three frequencies by a value, for example k, will increase the measurement range by k but decreases the resolution also by k. The resolution of t, as illustrated in FIG. 2, is the time of one count of the high frequency clock $f_H$ which is the inverse of the clock frequency. The resolution in the unit UI is the jitter-free frequency $f_0$ divided by the high frequency clock signal $f_H$. Maximum jitter measurement depends on the number of stages of the counter 26 and its resolution. The reference clock frequency $f_R$ must be selected as a multiple of the frequency of the jitter-free clock $f_0$, and jittered clock $f_J$, to maintain a constant phase difference for the no-jitter clock. Thus, the non-jitter clock $f_0$ and the jittered clock $f_J$ are harmonics of the reference signal $f_R$. The period of the reference signal $f_R$ determines the maximum count of the counter 26, assuming it has enough stages.

By way of example, for a jittered/jitter-free clock frequency $f_J$, $f_0$ of a 1.544 Mhz, a high frequency clock signal of 988.16 Mhz is used and the divisor m of the jitter-free clock generator 22 is selected as 640. The resolution for the high frequency $f_0$ is 1.01 nanoseconds and the resolution measurement of the jittered clock $f_J$ being equal to the jitter-free clock $f_0$ divided by the high frequency clock $f_H$ equals 0.00156 U.I. If the counter 26 is an eight-bit clock having a maximum count of 256, the reference clock frequency $f_R$ is selected to be one fourth the frequency of the jitter clock $f_0$. Thus, n equals 160. This allows a jitter measurement with high accuracy over a range of 0.25 U.I. The range selector 20 provides four ranges of measurement and accuracies. The divider has a k equal to 1, 4, 16, 64 for ranges of 0, 1, 2, 3, which provides the following range and resolution:

Range-0: 0.00156 U.I. resolution, 0.25 U.I. full range.
Range-1: 0.00625 U.I. resolution, 1 U.I. full range.
Range-2: 0.025 U.I. resolution, 4 U.I. full range.

Range-3: 0.1 U.I. resolution, 16 U.I. full range.

Although the present invention has been described and illustrated in detail, it is to be clearly understood that the same is by way of illustration and example only, and is not to be taken by way of limitation. The determinations of the peaks of A and B, the conversion to jitter and phase adjust and range adjust have been shown as individual elements, these functions may all be performed by an appropriately programmed computer. The spirit and scope of the present invention are to be limited only by the terms of the appended claims.

What is claimed is:

1. A jitter measuring device comprising:
   first clock means for generating a high frequency clock signal;
   second clock means for producing a jitter free clock signal from said high frequency clock signals of said first clock means to be provided to a device-under-test at a first output terminal;
   third clock means for producing a reference clock signal from said high frequency clock signals of said first clock means;
   first counter means for counting said high frequency clock signals;
   first control means, responsive to a jittered clock signal at an input terminal from said device-under-test and said third clock means, for controlling said first counter means to provide counts representing a difference of phase between said jittered clock signal and said reference clock signal; and
   converting means for converting said counts from said first counter means to a jitter measurement.

2. A jitter measuring device according to claim 1, wherein said converting means include:
   high means for determining the highest count from said first counter means;
   low means for determining the lowest count from said first counter means;
   jitter means for converting said highest and lowest count to said jitter measurement.

3. A jitter measuring device according to claim 2, wherein said jitter means includes means for taking the difference of said highest and lowest count and an encoder means for converting said difference to a jitter measurement.

4. A jitter measuring device according to claim 2, including phase adjustment means for determining the mean value of said highest and lowest count and adjusting the phase of said third clock means as a function of said mean value.

5. A jitter measuring device according to claim 4, wherein said phase adjustment means includes an encoder means for converting said mean value to a delay count and second counter means for delaying said third clock means from generating said reference clock signal by a number of high frequency clock signals equal to said delay count.

6. A jitter measuring device according to claim 4, wherein said means for determining said mean value includes an arithmetic logic unit.

7. A jitter measuring device according to claim 2, wherein:
   said first counter means includes a counter latch means controlled by said first control means for latching a count;
   said high means includes a high latch means and high comparator means for comparing the count in said high latch means with the count in said counter latch means and setting the count in said high latch means to the higher of the two counts; and
   said low means includes a low latch means and low comparator means for comparing the count in said low latch means with the count in said counter latch means and setting the count in said low latch means to the lower of the two counts.

8. A jitter measuring device according to claim 1, including phase adjustment means for adjusting the phase of said third clock means.

9. A jitter measuring device according to claim 8, wherein said phase adjustment means includes:
   high means for determining the highest count from said first counter means;
   low means for determining the lowest count from said first counter means;
   means for determining the mean value of said highest and lowest count;
   and means for adjusting the phase of said third clock means as a function of said mean value.

10. A jitter measuring device according to claim 9, wherein said phase adjustment means adjusts said phase of said third clock means to be at said same mean value.

11. A jitter measuring device according to claim 9, wherein said phase adjustment means includes an encoder means for converting said mean value to a delay count and second counter means for delaying said third clock means from generating said reference clock signal by a number of high frequency clock signals equal to said delay count.

12. A jitter measuring device according to claim 8, wherein said phase adjustment means is manually actuated.

13. A jitter measuring device according to claim 1, including range means for adjusting the range of jitter of said jitter measuring device.

14. A jitter measuring device according to claim 13, wherein said range means includes:
   first range means for adjusting the frequency of said jittered clock signal at said input terminal;
   second range means for adjusting the frequency of said high frequency clock signal provided to said first counter means; and
   third range means for adjusting the frequency of said third clock means.

15. A jitter measuring device according to claim 14, wherein said second and third range means includes a common first divider means for dividing said high frequency clock signal by an adjustable divisor and said first range means includes a second divider means for dividing said jittered clock signal by the same adjustable divisor as said first divider means.

16. A jitter measuring device according to claim 1, wherein said second and third clock means include second and third clock divider means respectively for dividing said high frequency clock signal by second and third divisors respectively.

17. A jitter measuring device according to claim 16, wherein said second divisor is a whole number multiple of said third divisor.

18. A jitter measuring device according to claim 1, wherein said third clock means producers said reference clock signal as a harmonic of said jitter-free clock signal produced by said second clock means.

19. A jitter measuring device comprising:
   first clock means for producing a jitter-free clock signal to a device-under-test at a first output terminal;

second clock means for producing a reference clock signal;

first input terminal for receiving a jittered clock signal from said device-under-test;

measuring means for measuring the phase difference between said jittered clock signal and said reference clock signal; and converting means for converting said phase difference to a jitter measurement;

said converting means including high means for determining the highest phase difference from said measuring, low means for determining the lowest phase difference from said counter, and jitter means for converting said highest and lowest phase difference to said jitter measurement.

20. A jitter measuring device according to claim 19, wherein said jitter means includes means for taking the difference of said highest and lowest phase difference and an encoder means for converting said difference to a jitter measurement.

21. A jitter measuring device according to claim 19, including phase adjustment means for determining the mean value of said highest and lowest phase difference and adjusting the phase of said second clock means as a function of said mean value.

22. A method of measuring jitter comprising:
applying a first clock signal to a device-under-test;
receiving a jittered clock signal from a device-under-test;
generating a reference clock signal;
measuring the phase difference between said jittered clock signal and said reference clock signal by counting a number of clock signals from a high frequency clock between a transition of said jittered clock signal and a transition of said reference clock signal as a measure of phase difference; and
converting said phase difference to a jitter measurement.

23. A method according to claim 22, wherein converting includes determining the highest and lowest count and converting said highest and lowest count to said jitter measurement.

24. A method according to claim 23, wherein converting said count includes taking the difference of said highest and lowest count.

25. A method according to claim 23, including adjusting the phase of said reference clock signal as a function of said highest and lowest count.

26. A method according to claim 25, wherein adjusting includes determining the mean value of said highest and lowest count and adjusting said reference clock signal to be at said mean value.

27. A method according to claim 22, including adjusting the frequency of said jittered clock signal and said reference clock signal to extend the jitter measurement range.

28. A method according to claim 22, including selecting the frequency of said reference clock signal to be a harmonic of said first clock signal.

29. A jitter measuring device comprising:
first clock means for producing a jitter-free clock signal to a device-under-test at a first output terminal;
second clock means for producing a reference clock signal;
first input terminal for receiving a jittered clock signal from said device-under-test;
measuring means for measuring the phase difference between said jittered clock signal and said reference clock signal;
converting means for converting said phase difference to a jitter measurement;
first range means for adjusting the frequency of said second clock means;
second range means for adjusting the frequency of said jittered clock signal at said input terminal; and
wherein adjusting said first and second range means by the same proportion adjusts the range of said jitter measuring device.

30. A method of measuring jitter comprising:
applying a first clock signal to a device-under-test;
receiving a jittered clock signal from a device-under-test;
generating a reference clock signal;
measuring the phase difference between said jittered clock signal and said reference clock signal;
converting said phase difference to a jitter measurement; and
adjusting the frequency of said jittered clock signal and said reference clock signal to extend the jitter measurement range.

* * * * *